United States Patent [19]
Petti et al.

[11] Patent Number: 5,523,258
[45] Date of Patent: Jun. 4, 1996

[54] METHOD FOR AVOIDING LITHOGRAPHIC ROUNDING EFFECTS FOR SEMICONDUCTOR FABRICATION

[75] Inventors: Christopher J. Petti, Mountain View; Andre N. Stolmeijer, Santa Clara, both of Calif.; Mark A. Helm, Boise, Id.

[73] Assignee: Cypress Semiconductor Corp., San Jose, Calif.

[21] Appl. No.: 235,509

[22] Filed: Apr. 29, 1994

[51] Int. Cl.$^6$ .................................................. H01L 21/44
[52] U.S. Cl. .......................... 437/186; 437/229; 437/924; 148/DIG. 102
[58] Field of Search .................................. 437/186, 229, 437/924; 148/DIG. 102; 430/312, 313, 5, 394

[56] References Cited

U.S. PATENT DOCUMENTS

| | | | |
|---|---|---|---|
| 4,792,534 | 12/1988 | Tsuji et al. | 437/229 |
| 5,023,203 | 6/1991 | Choi | 437/229 |
| 5,039,625 | 8/1991 | Reisman et al. | 437/69 |
| 5,208,124 | 5/1993 | Sporon-Fiedler et al. | 430/5 |
| 5,264,718 | 11/1993 | Gill | 257/316 |
| 5,316,878 | 5/1994 | Saito et al. | 430/5 |
| 5,320,932 | 6/1994 | Haraguchi et al. | 430/313 |

FOREIGN PATENT DOCUMENTS 5105948  8/1980  Japan .

OTHER PUBLICATIONS

Ikeda, S., et al., "A Polysilicon Transistor Technology for Large Capacity SRAMs," *IEDM Technical Digest*, International Electron Devices Meeting, San Francisco, CA, pp. 469–472 (Dec. 9–12, 1990).

Itabashi, K., et al., "A Split Wordline Cell for 16Mb SRAM Using Polysilicon Sidewall Contacts," *IEDM Technical Digest*, International Electron Devices Meeting, Washington, DC, pp. 477–480 (Dec. 8–11, 1991).

Verhaar, R. D. J., et al., "A 25μm$^2$ Bulk Full CMOS SRAM Cell Technology with Fully Overlapping Contacts," *IEDM Technical Digest*, International Electron Devices Meeting, San Francisco, CA, pp. 473–476 (Dec. 9–12, 1990).

"Method to Incorporate Three Sets of Pattern Information in Two Photomasking Steps," *IBM Technical Disclosure Bulletin*, vol. 32, No. 8A, pp. 218–219 (Jan. 1990).

"Dual–Image Resist for Single–Exposure Self–Aligned Processing," *IBM Technical Disclosure Bulletin*, vol. 33, No. 2, pp. 447–449 (Jul. 1990).

"Complementary Selective Writing by Direct–Write E–Beam/Optical Lithography using Mixed Positive and Negative Resist," *IBM Technical Disclosure Bulletin*, vol. 33, No. 3A, pp. 62–63 (Aug. 1990).

"Multilayer Circuit Fabrication using Double Exposure of Positive Resist," *IBM Technical Disclosure Bulletin*, vol. 36, No. 10, pp. 423–424 (Oct. 1993).

Helm, M., et al., "A Low Cost, Microprocessor Compatible, 18.4 μm$^2$, 6–T Bulk Cell Technology for High Speed SRAMs," *1993 Symposium on VLSI Technology: Digest of Technical Papers*, 1993 VLSI Technology Symposium, Kyoto, pp. 65–66 (May 17–19, 1993).

*Primary Examiner*—George Fourson
*Assistant Examiner*—Thomas G. Bilodeau
*Attorney, Agent, or Firm*—Blakely, Sokoloff, Taylor & Zafman

[57] ABSTRACT

The use of separate masks to pattern the same layer of material formed over a semiconductor substrate serves to reduce or avoid lithographic rounding effects. A layer of material formed over a semiconductor substrate may be patterned in accordance with separate masks. A first mask may have a feature which is substantially perpendicular to a feature of a separate second mask. Where the layer is patterned to form transistor gates, the minimum amount each transistor gate should extend over the edge of its active region under the endcap rule may be reduced. In this regard, a line pattern mask and a gap mask are used to avoid lithographic rounding effects in forming the transistor gates. Semiconductor devices may thus be fabricated with higher packing densities as transistors may be placed closer to one another.

30 Claims, 10 Drawing Sheets

METHOD FOR AVOIDING LITHOGRAPHIC ROUNDING EFFECTS FOR SEMICONDUCTOR FABRICATION

BACKGROUND OF THE INVENTION

1. Field of the Invention

The present invention relates generally to the field of semiconductor fabrication and, more particularly, to the field of pattern or etch processing for semiconductor fabrication.

2. Description of the Related Art:

In typical semiconductor fabrication processes, various layers of materials formed over a semiconductor substrate are patterned or etched in accordance with various functional and/or design requirements for fabricating a desired semiconductor device. The pattern or etch process typically involves a lithography process. In a typical lithography process, photoresist is deposited over the layer to be patterned. This photoresist is then exposed to radiation such as ultraviolet radiation through a mask which defines the pattern to be created in the photoresist. Depending on whether positive or negative photoresist is used, the exposed portions of photoresist are made either soluble or insoluble, respectively, in a developer. As a result, a patterned photoresist layer remains over the underlying layer after the photoresist is developed. Those portions of the underlying layer which are not covered by photoresist may then be etched using suitable etch techniques and chemistries, generally depending on the material of the underlying layer. The pattern in the photoresist is thus replicated in the underlying layer.

The above lithography process, however, limits certain design considerations for semiconductor fabrication. In the semiconductor wafer illustrated in FIG. 1, for example, two adjacent transistors 109a and 109b have been distanced apart from one another to avoid electrical shorting. The transistors 109a and 109b have been formed over a substrate 100 which has a field oxide region 102 to electrically isolate active region 106a from active region 106b. Using the above lithography process, polycrystalline silicon (polysilicon or poly-Si) gates 108a and 108b of each transistor 109a and 109b, respectively, have been defined to extend over the edge of each active region 106a and 106b, respectively, to account for line width variation of the polysilicon gate, any misalignment of the mask in patterning the polysilicon into each gate, and for lithographic rounding effects at the end of each polysilicon gate.

Lithographic rounding occurs as a result of the diffraction of radiation around the edges and corners in the mask through which the photoresist is exposed. As illustrated in FIG. 1, the ends of each polysilicon gate 108a and 108b are rounded because of the diffraction of radiation around the edges of the mask used to define the pattern in the photoresist for each polysilicon gate 108a and 108b. When the polysilicon was etched using this patterned photoresist, then, the rounding effect became replicated in the patterned polysilicon. The lithographic rounding effect reduced the width of the polysilicon gate at its end. If the end of the polysilicon gate did not sufficiently extend over the edge of its active region so that the full width of the polysilicon gate covered this edge, the channel length of the gate would be reduced as a result of this narrowed gate end. The transistor may also be shorted if the narrowed end of the polysilicon gate did not sufficiently cover the edge of its active region.

To determine the minimum amount each polysilicon gate should be designed to extend over the edge of its active region, a so-called "endcap rule" is generally used. Under the endcap rule, for example, a polysilicon gate may be designed to extend over the edge of its active region for 0.25 µm to account for line width variation and misalignment and for an additional 0.15 µm to account for lithographic rounding effects, for a total extension of 0.40 µm. Furthermore, the polysilicon gate must be spaced apart from other polysilicon gates to avoid shorting. This poly-poly spacing is typically constrained by the resolution limits of the lithography process. Using 0.6 µm lithography, the poly-poly spacing may be as small as 0.6 µm. In fabricating a semiconductor device using the above endcap rule example, then, transistors would be spaced 1.4 µm apart (0.4 µm first polysilicon gate extension +0.6 µm poly-poly spacing +0.4 µm second polysilicon gate extension). The above lithography process therefore limits the packing density of the semiconductor device being fabricated as transistors must be placed further apart from one another to avoid various defects.

Thus, what is needed is a patterning or etch process which reduces or avoids lithographic rounding effects. What is also needed is a patterning or etch process which reduces the minimum extension of a transistor gate over the edge of its active region under the endcap rule. What is still further needed is a patterning or etch process which provides for the fabrication of semiconductor devices with higher packing densities.

BRIEF SUMMARY OF THE INVENTION

The present invention advantageously provides for a patterning or etch process which may be used to reduce or avoid lithographic rounding effects. The present invention also provides for a patterning or etch process which may be used to reduce the minimum extension of a transistor gate over the edge of its active region under the endcap rule. The present invention still further provides for a patterning or etch process which may be used to provide for the fabrication of semiconductor devices with higher packing densities.

In accordance with the present invention, a first layer comprising a first material is formed over a semiconductor substrate. The first layer is patterned with a first pattern. The first layer is patterned with a second pattern after the first layer has been patterned with the first pattern. In patterning the first layer with the first pattern, the first layer may be patterned with a first feature. The first layer may be patterned with a second feature substantially perpendicular to the first feature when the first layer is patterned with the second pattern. The first material may comprise a conductive material. The first layer may be patterned to form transistor gates over the semiconductor substrate.

Also in accordance with the present invention, a first layer comprising a first material is formed over a semiconductor substrate. A mask layer comprising a second material is formed over the semiconductor substrate. The mask layer is patterned with a first pattern and a second pattern where the first pattern is used for patterning the mask layer and the second pattern is used for patterning the mask layer after the first pattern has been used. The first layer is patterned with the mask layer after the mask layer has been patterned. When the first pattern is used, the mask layer may be patterned with the first pattern. When the second pattern is used, the mask layer may be patterned with the second pattern. The first pattern may comprise a first feature. The second pattern may comprise a second feature substantially perpendicular to the first feature. The first material may comprise a conductive material. The first layer may be patterned to form transistor gates over the semiconductor substrate. The second material may comprise photosensitive material. The second material may also comprise an oxide or nitride. The mask layer may be patterned with a gap. Spacers may be formed in the gap of the mask layer. The first layer may be patterned after the mask layer has been patterned and after the spacers have been formed in the gap of the mask layer.

Still further in accordance with the present invention, a first layer comprising a first material is formed over a semiconductor substrate. A second layer comprising a second material is formed over the semiconductor substrate. The second layer is patterned in accordance with a first pattern. A mask layer comprising a third material is formed over the second layer after the second layer has been patterned. The mask layer is patterned in accordance with a second pattern and a third pattern where the second pattern is used for patterning the mask layer and the third pattern is used for patterning the mask layer after the second pattern has been used. The first layer is patterned in accordance with the mask layer after the mask layer has been patterned. When the second pattern is used, the mask layer may be patterned with the second pattern. When the third pattern is used, the mask layer may be patterned with the third pattern. The second pattern may comprise a first feature. The third pattern may comprise a second feature substantially perpendicular to the first feature. The first material may comprise a conductive material. The first layer may be patterned to form transistor gates over the semiconductor substrate. The third material may comprise photosensitive material. The third material may also comprise an oxide or nitride. A silicide layer may be formed over exposed portions of the first layer. The second layer may be patterned with a gap. Spacers may be formed in the gap of the second layer. The first layer may be patterned in accordance with the mask layer and in accordance with the second layer after the second layer has been patterned and after the spacers have been formed in the gap of the second layer.

Accordingly, the present invention may be used to reduce or avoid lithographic rounding effects in patterning a layer for the fabrication of a semiconductor device. The present invention may also be used to reduce the minimum extension of a transistor gate over the edge of its active region under the endcap rule. The present invention may still further be used for fabricating semiconductor devices with higher packing densities.

While the above advantages of the present invention have been described, other attendant advantages, objects, and uses of the present invention will become evident to one of ordinary skill in the art based on the following detailed description with reference to the accompanying drawings.

BRIEF DESCRIPTION OF THE DRAWINGS

The present invention is illustrated by way of example and not limitation in the figures of the accompanying drawings in which like references indicate similar elements and in which.

DETAILED DESCRIPTION

A specific embodiment or embodiments in accordance with the present invention for a method for avoiding lithographic rounding effects for semiconductor fabrication is described. In the following description, numerous specific details are set forth such as specific thicknesses, materials, processing sequences, semiconductor devices, etc., in order to provide a thorough understanding of the present invention. It will be evident, however, to one of ordinary skill in the art that the present invention may be practiced without these specific details. In other instances, well-known processing steps, equipment, etc., have not been described in particular detail so that the present invention is not unnecessarily obscured.

The present invention may be used in fabricating various static random access memories (SRAM's), such as those described in the article: M. Helm, et al., "A Low Cost, Microprocessor Compatible, 18.4 $\mu m^2$, 6-T Bulk Cell Technology for High Speed SRAMs," 1993 *Symposium on VLSI Technology: Digest of Technical Papers*, 1993 VLSI Technology Symposium, Kyoto, May 17–19, 1993, pp. 65–66. That article is herein incorporated by reference. However, it is to be understood that the present invention is not limited to its use in SRAM fabrication technology but rather, for example, may also be used in fabricating various other types of semiconductor devices.

Figure 3A:
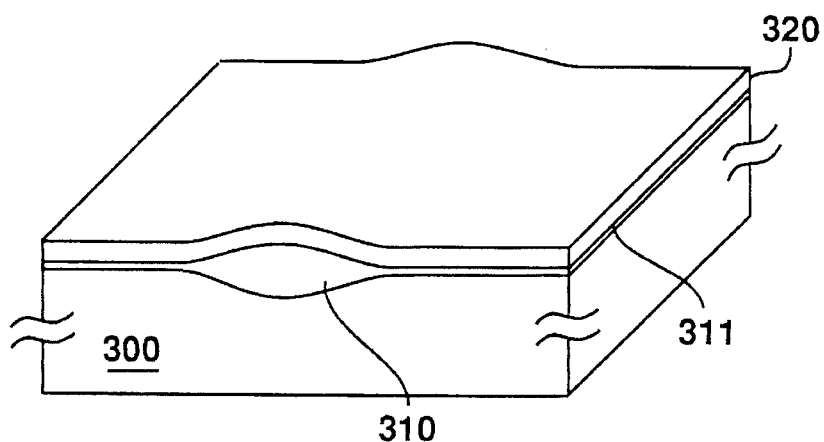
FIG. 3a illustrates a perspective, partial cross-sectional view of an exemplary semiconductor wafer in accordance with the present invention.
Figure 5A:
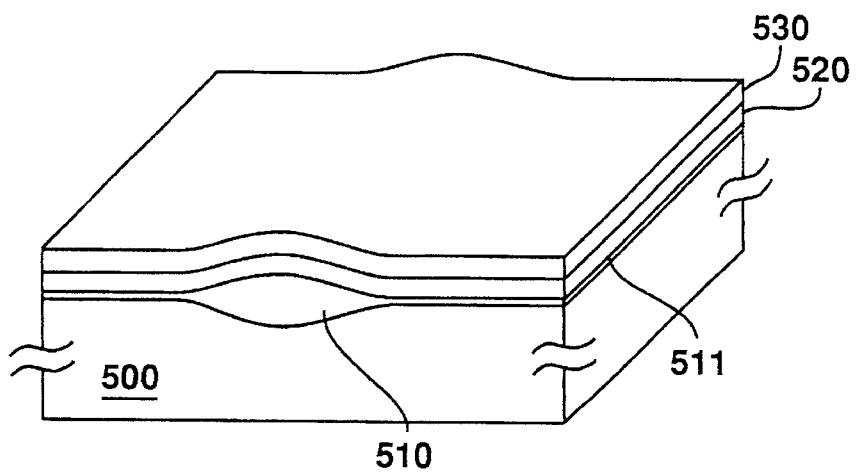
FIG. 5a illustrates a perspective, partial cross-sectional view of an exemplary semiconductor wafer in accordance with the present invention.
Figure 5B:
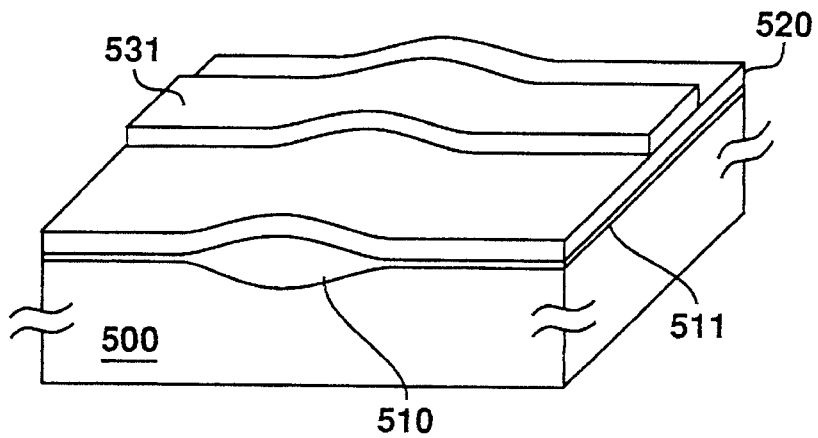
FIG. 5b illustrates a perspective, partial cross-sectional view of the semiconductor wafer of FIG. 5a following a first patterning of a mask layer in accordance with the present invention.
Figure 5C:
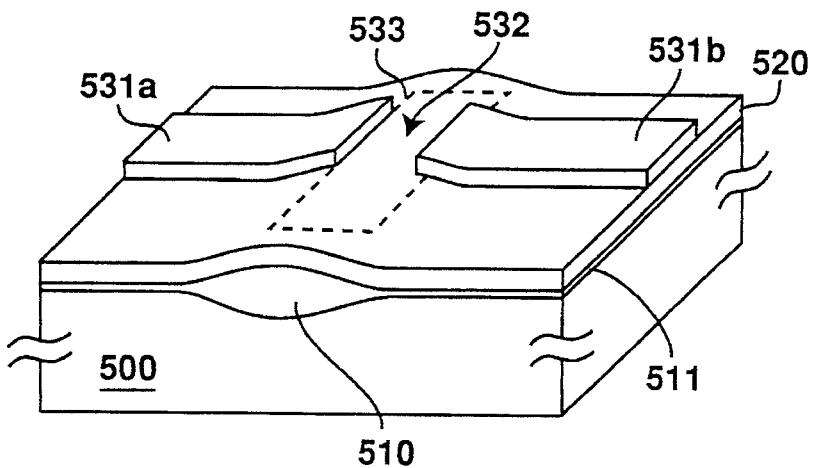
FIG. 5c illustrates a perspective, partial cross-sectional view of the semiconductor wafer of FIG. 5b following a second patterning of the mask layer in accordance with the present invention.
Figure 5D:
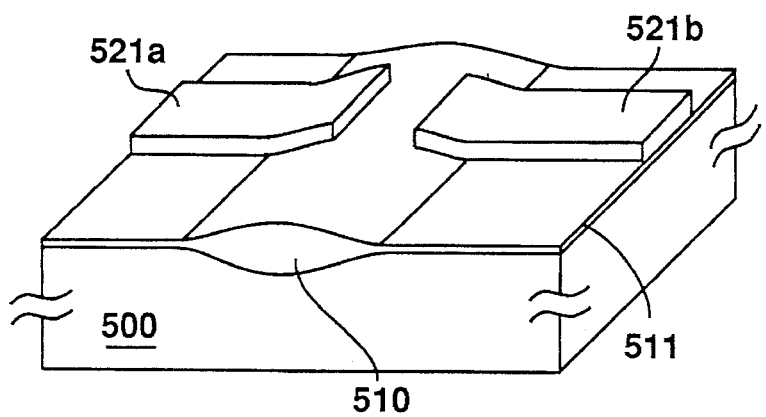
FIG. 5d illustrates a perspective, partial cross-sectional view of the semiconductor wafer of FIG. 5c following an etch of an underlying layer using the patterned mask layer in accordance with the present invention.
Figure 6:
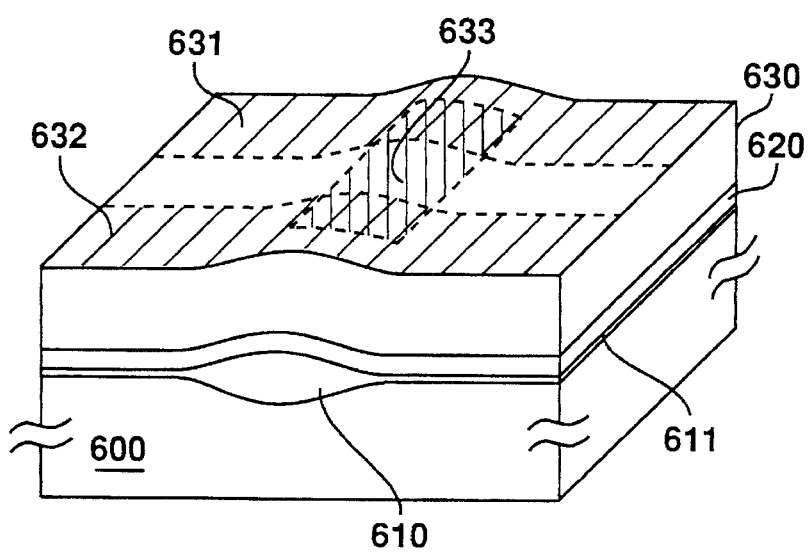
FIG. 6 illustrates a perspective, partial cross-sectional view of another exemplary semiconductor wafer in accordance with the present invention.
Figure 7:
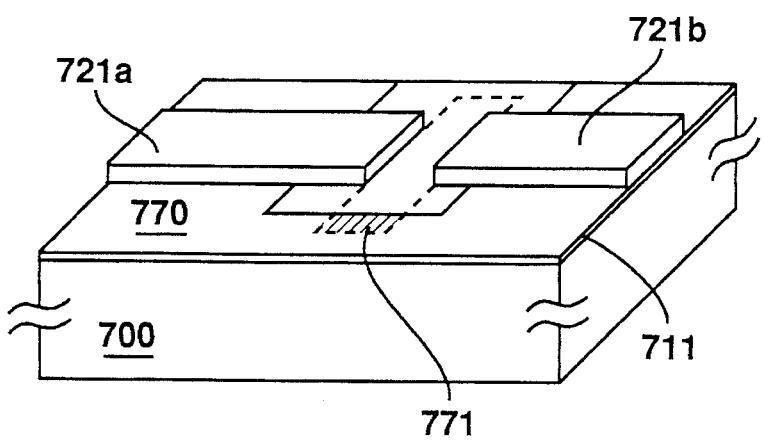
FIG. 7 illustrates a perspective, partial cross-sectional view of an exemplary semiconductor wafer where the method of FIG. 4 is appropriate for patterning.
Figure 9A:
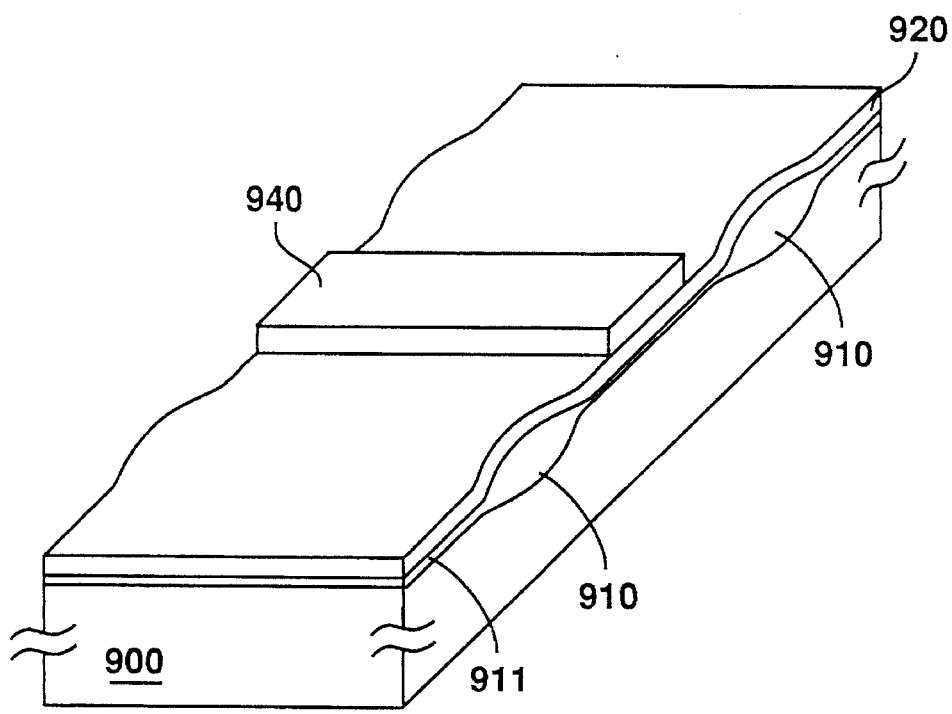
FIG. 9a illustrates a perspective, partial cross-sectional view of an exemplary semiconductor wafer in accordance with the present invention.
Figure 9B:
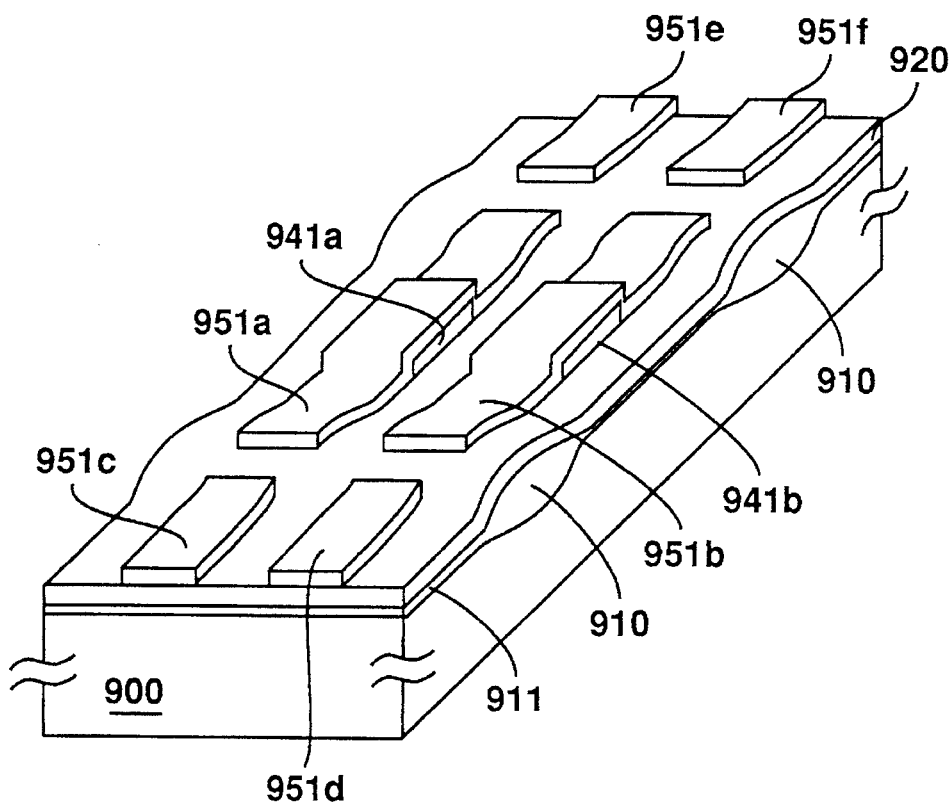
FIG. 9b illustrates a perspective, partial cross-sectional view of the semiconductor wafer of FIG. 9a following the patterning of a mask layer in accordance with the present invention.
Figure 9C:
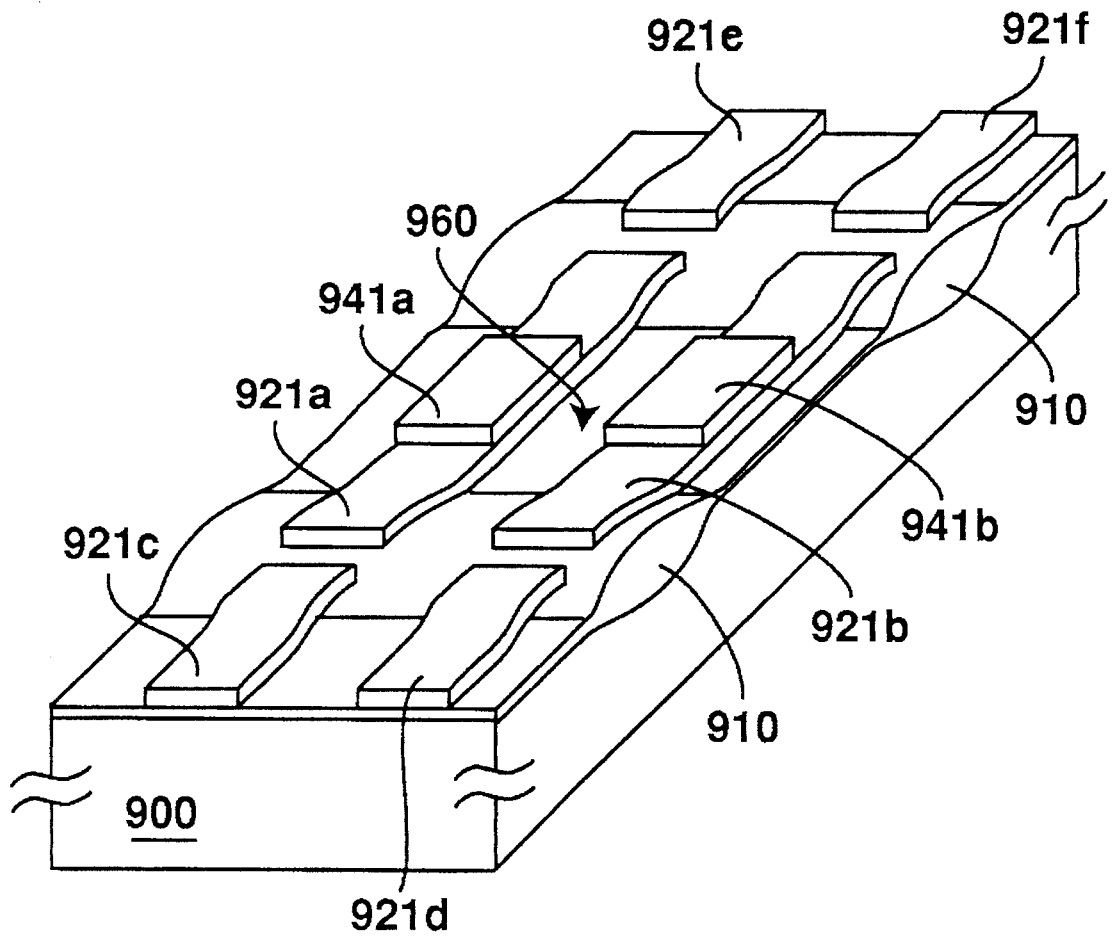
FIG. 9c illustrates a perspective, partial cross-sectional view of the semiconductor wafer of FIG. 9b following an etch of an underlying layer using the patterned mask layer in accordance with the present invention.
Figure 10A:
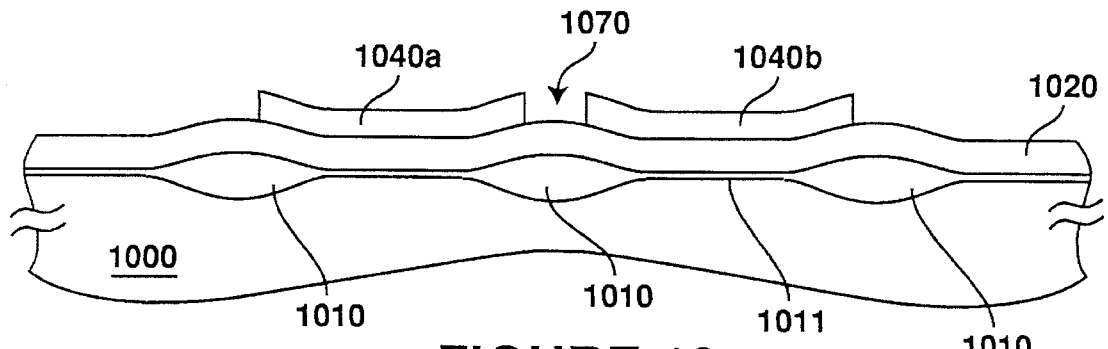
FIG. 10a illustrates a cross-sectional view of an exemplary semiconductor wafer in accordance with the present invention.

In accordance with the present invention, a semiconductor substrate is provided as illustrated in FIG. 3a by substrate 300, in FIG. 5a by substrate 500, in FIG. 6 by substrate 600, in FIG. 7 by substrate 700, in FIG. 9a by substrate 900, and in FIG. 10a by substrate 1000. This substrate may be a silicon substrate, yet it is to be appreciated that a variety of other types of semiconductor substrates may be used, for example, depending upon one's specific design and/or functional requirements for the semiconductor device to be fabricated. Furthermore, it is to be understood that the views of FIGS. 3a–3c, 5a–5d, 6, 7, 9a–9c, and 10a–10e are merely partial views of a larger semiconductor wafer so as to provide for a clearer understanding of the present invention. The present invention may also be used in patterning layers elsewhere on the substrate partially illustrated in the drawings.

Figure 1:
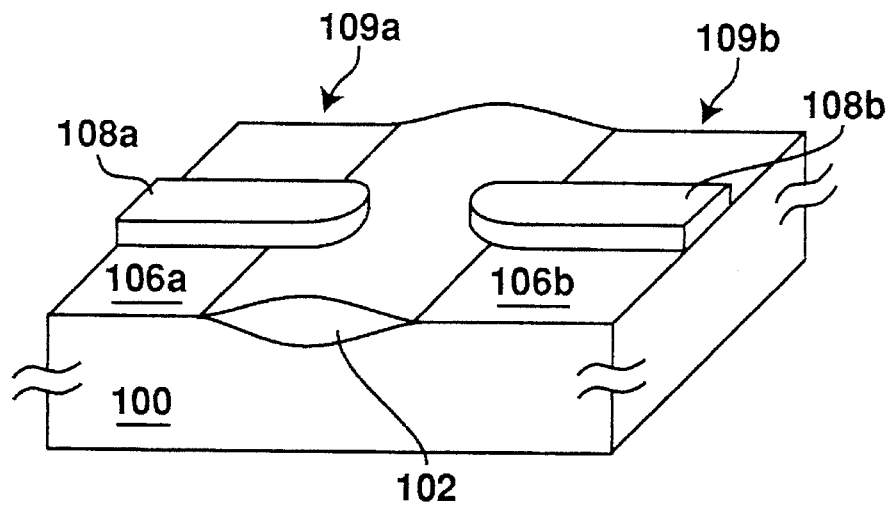
FIG. 1 illustrates a perspective, cross-sectional view of two adjacent transistors formed over a semiconductor substrate in a prior art embodiment.
Figure 2:
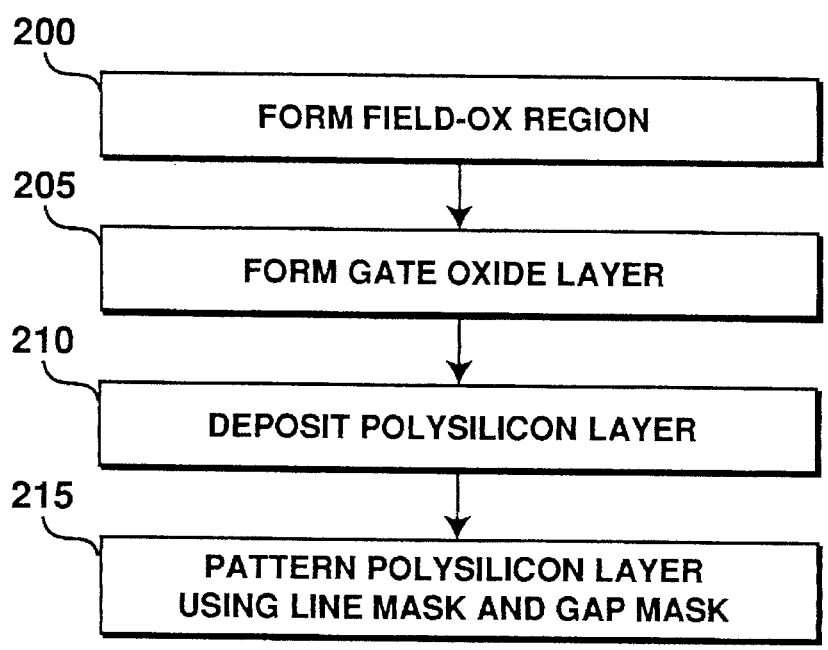
FIG. 2 illustrates, in the form of a flow diagram, a first exemplary method for patterning a layer formed over a semiconductor substrate in accordance with the present invention.

FIG. 2 illustrates, in the form of a flow diagram, a first exemplary method for patterning a layer formed over a semiconductor substrate in accordance with the present invention. So as to better explain this first exemplary method of the present invention, FIGS. 3a, 3b, and 3c will be used to illustrate the steps performed in the method of FIG. 2.

In step 200 of FIG. 2, a field oxide region is formed over the semiconductor substrate, as illustrated in FIG. 3a where field oxide region 310 has been formed over substrate 300. This field oxide region may be formed using any suitable process, for example a LOCal Oxidation of Silicon (LOCOS) isolation process, and may serve to isolate separate active regions on the substrate from one another. While the field oxide region is illustrated in FIG. 3a as being raised above the surface of the substrate with a bird's beak form, it is to be understood that the field oxide region may be formed differently as the form of the field oxide region may depend on the process used to form this region. The field oxide region may, for example, be level with the surface of the substrate. A gate oxide layer may then be formed over the active regions of the substrate in step 205 of FIG. 2, as illustrated in FIG. 3a where gate oxide layer 311 has been formed over substrate 300. This gate oxide layer contains silicon dioxide ($SiO_2$) and may be grown on or deposited over the surface of the wafer. The gate oxide layer may be approximately 100 Angstroms (Å) to approximately 150 Å in thickness. Other thicknesses may also be used, however. Approximately 1500 Å to approximately 3000 Å of polysilicon may then be deposited over the wafer in step 210 of FIG. 2, as illustrated in FIG. 3a where polysilicon layer 320 has been deposited over substrate 300. Other thicknesses of polysilicon may also be used here.

Figure 3B:
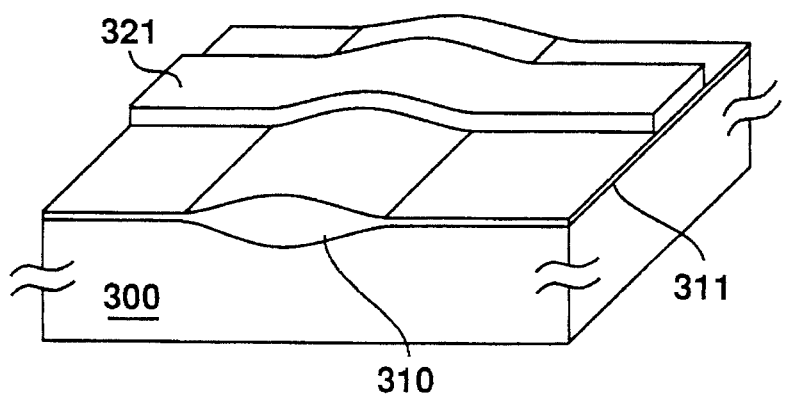
FIG. 3b illustrates a perspective, partial cross-sectional view of the semiconductor wafer of FIG. 3a following a first patterning of a layer in accordance with the present invention.

The polysilicon may now be patterned in step 215 of FIG. 2 to form polysilicon gates over the wafer. Here, the polysilicon layer may be patterned into a polysilicon line pattern which crosses over two active regions separated by the field oxide region, as illustrated in FIG. 3b where polysilicon layer 320 of FIG. 3a has been etched to form polysilicon line pattern 321 which crosses over two active regions separated by field oxide region 310. In patterning the polysilicon layer here, any suitable patterning process may be used. For example, a layer of photosensitive material such as photoresist may be formed over the wafer, exposed to radiation such as ultraviolet radiation through a suitable line pattern mask, and developed to define in the photosensitive material the polysilicon line pattern to be etched from the underlying polysilicon layer. The polysilicon layer may then be etched using a suitable etch technique and chemistry to form the polysilicon line pattern. Here, a timed etch or an endpoint etch may be used. The etch may be selective to oxide to protect against spiking through the gate oxide layer. The remaining photosensitive material may then be removed following the polysilicon etch.

Figure 3C:
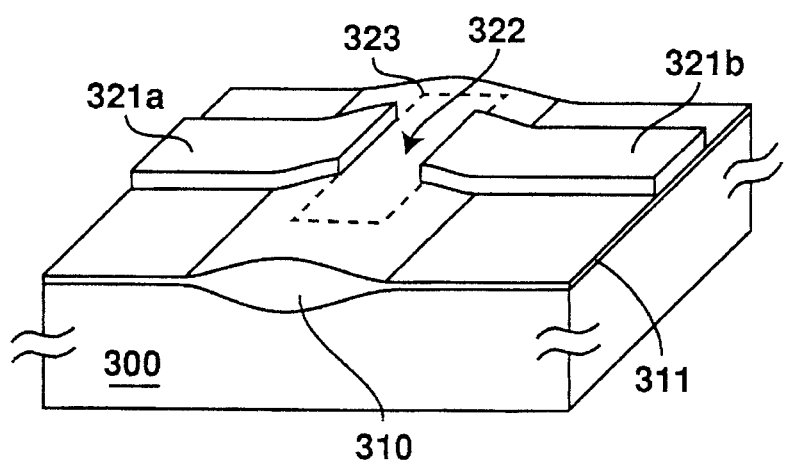
FIG. 3c illustrates a perspective, partial cross-sectional view of the semiconductor wafer of FIG. 3b following a second patterning of the layer in accordance with the present invention.

Once the polysilicon line pattern has been formed, it may be patterned into appropriate polysilicon gates. This is illustrated in FIG. 3c where polysilicon line pattern 321 of FIG. 3b has been patterned into polysilicon gates 321a and 321b by etching a gap 322 in polysilicon line pattern 321. In patterning the polysilicon line pattern here, any suitable patterning process may be used. For example, a layer of photosensitive material such as photoresist may be formed over the wafer, exposed to radiation such as ultraviolet radiation through a suitable gap mask, and developed to define in the photosensitive material the gap to be etched from the polysilicon line pattern. The shape of the gap pattern in the photosensitive material is illustrated in FIG. 3c by dashed-line rectangle 323. It is to be understood, however, that the gap pattern is not limited to this illustrated shape but rather may be shaped differently in defining the gap to be etched from the polysilicon line pattern. For example, the gap pattern may be shaped so as to extend across more than one polysilicon line pattern so that polysilicon gates may be formed elsewhere over the wafer. The gap pattern in the photosensitive material preferably exposes the entire width of the polysilicon line pattern so as to ensure the polysilicon line pattern will be completely separated by the gap to be etched. It is to be appreciated that the gap pattern in the photosensitive material may expose portions of the field oxide region which are not covered by the polysilicon line pattern. The gap may then be etched from the polysilicon line pattern using a suitable etch technique and chemistry. Preferably, a polysilicon:oxide selective etch is used as portions of the field oxide region which are not covered by the polysilicon line pattern and which are exposed by the gap pattern in the photosensitive material may be subjected to this etch. The selectivity of this etch may be approximately 25:1, yet other suitable polysilicon- :oxide selectivity ratios may also be used. The selectivity ratio for this etch may depend, for example, on the thicknesses of the polysilicon layer and the underlying oxide layer.

The gap etch essentially serves to "cut" the polysilicon line pattern as the features of the gap pattern are perpendicular or substantially perpendicular to the polysilicon line pattern. Accordingly, the lithographic rounding effects replicated at the ends of each polysilicon gate as a result of typical lithography processes are avoided. In applying the endcap rule, then, lithographic rounding effects need not be considered in determining the amount each polysilicon gate should extend over the edge of its active region. Transistors may thus be placed closer to one another over the wafer, providing for the fabrication of semiconductor devices with higher packing densities. Referring to the example given above, each polysilicon gate need only extend over the edge of its active region for approximately 0.25 μm. That is, the endcap rule need only account for line width variation and misalignment; the approximately 0.15 μm extension to account for lithographic rounding effects is no longer needed. With a poly-poly spacing of approximately 0.5 μm, using 0.5 μm lithography, the spacing between transistors may be only approximately 1.0 μm (0.25 μm first polysilicon gate extension +0.5 μm polypoly spacing +0.25 μm second polysilicon gate extension), as compared to the 1.4 μm spacing required above where the compensation for lithographic rounding effects increased this spacing.

While the etching of the polysilicon line pattern from the polysilicon layer has been described above as having been performed prior to the etching of the gap in the polysilicon line pattern, it is to be appreciated that the gap pattern may be etched from the polysilicon layer prior to the etching of the polysilicon line pattern from the polysilicon layer. Here, the gap pattern and polysilicon line pattern may be etched using suitable etch techniques and chemistries. The polysilicon line pattern etch, here, may be a polysilicon:oxide selective etch as portions of the field oxide region may be subjected to this line pattern etch as a result of becoming exposed because of the gap etch.

Figure 4:
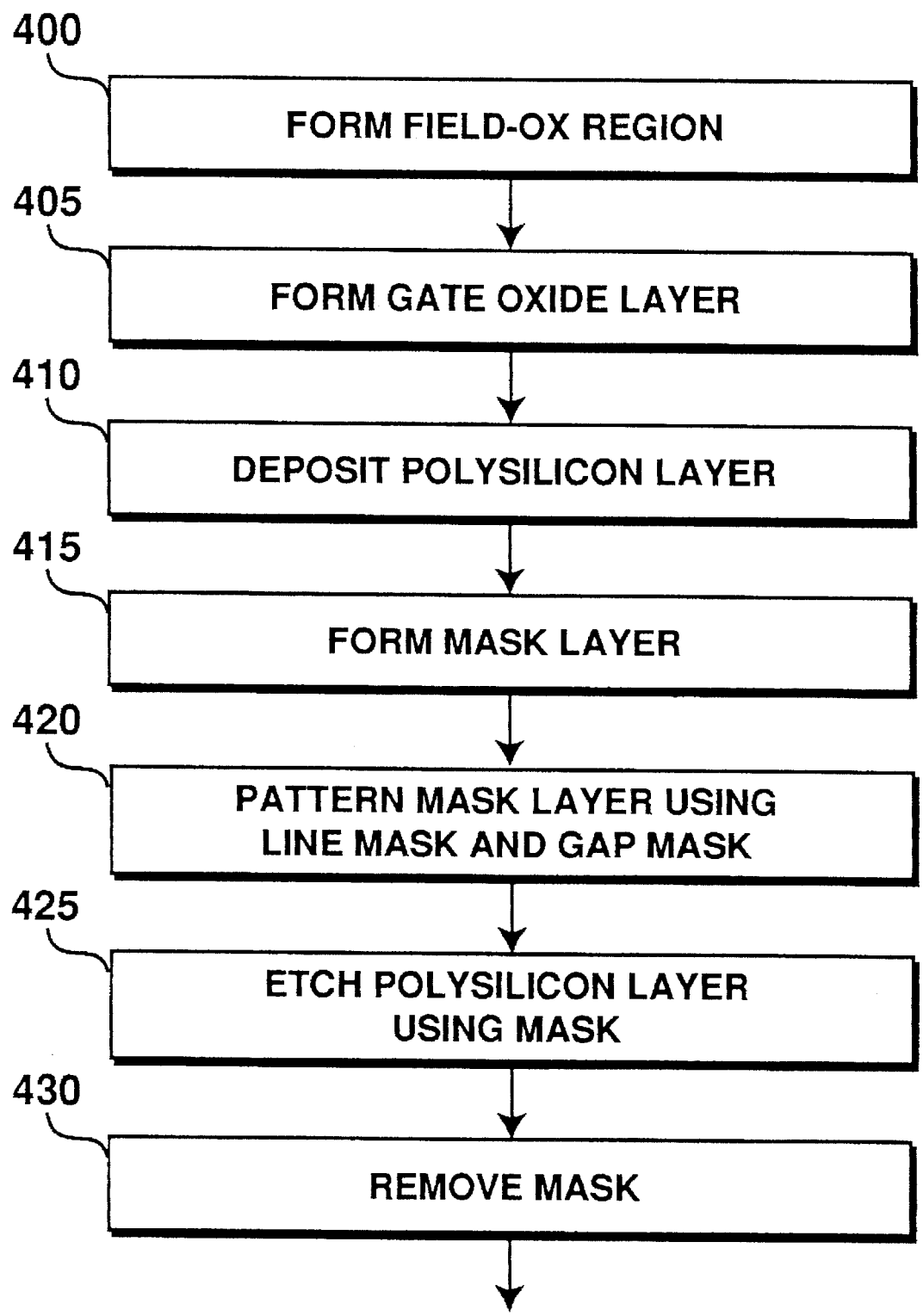
FIG. 4 illustrates, in the form of a flow diagram, a second exemplary method for patterning a layer formed over a semiconductor substrate in accordance with the present invention.

FIG. 4 illustrates, in the form of a flow diagram, a second exemplary method for patterning a layer formed over a semiconductor substrate in accordance with the present invention. So as to better explain this second exemplary method of the present invention, FIGS. 5a, 5b, 5c, and 5d will be used to illustrate the steps performed in the method of FIG. 4.

Steps 400, 405, and 410 of FIG. 4 are similarly performed as steps 200, 205, and 210 of FIG. 2, respectively, discussed above. The above discussion pertaining to steps 200, 205, and 210 therefore similarly applies here as well. Briefly, a field oxide region, gate oxide layer, and polysilicon layer are formed over a semiconductor substrate. This is illustrated in FIG. 5a where field oxide region 510, gate oxide layer 511, and polysilicon layer 520 have been formed over substrate 500.

In step 415 of FIG. 4, then, a mask layer is formed over the wafer, as illustrated in FIG. 5a where mask layer 530 has been formed over substrate 500. The mask layer may contain any suitable material or materials which may be patterned to provide for a mask when the underlying polysilicon layer is etched. The mask layer may be a hard mask layer, for example. The mask layer may comprise approximately 200 Å to approximately 2000 Å of silicon dioxide ($SiO_2$) or of silicon nitride ($Si_3N_4$), for example. Other thicknesses of these materials may also be used and may depend, for example, on the deposition technique used to form this mask layer or the etch technique used to etch this mask layer. Furthermore, where the mask layer comprises silicon dioxide ($SiO_2$), it may be deposited or grown over the polysilicon layer.

The mask layer is then patterned in step 420 of FIG. 4 to define the pattern for polysilicon gates to be etched from the underlying polysilicon layer. Here, the mask layer may first be patterned to define a line pattern for the underlying polysilicon layer. This line pattern in the mask crosses over two active regions separated by the field oxide region, as illustrated in FIG. 5b where mask layer 530 of FIG. 5a has been patterned to form line pattern 531 which crosses over two active regions separated by field oxide region 510. In patterning the mask layer here, any suitable patterning process may be used. Where the mask layer is a hard mask layer, for example, a layer of photosensitive material such as photoresist may be formed over the wafer, exposed to radiation such as ultraviolet radiation through a suitable line pattern mask, and developed to define in the photosensitive material the line pattern to be etched from the mask layer. The mask layer may then be etched using a suitable etch technique and chemistry to form the line pattern. Here, a timed etch or an endpoint etch may be used. The etch may be selective to polysilicon to protect the underlying polysilicon layer from any overetch. It is to be appreciated, though, that the etch technique used here does not have to be highly selective to polysilicon because the underlying polysilicon which may be subjected to any overetch will later be removed. The remaining photosensitive material may then be removed following this etch.

Once the line pattern has been formed, it may be patterned again to define the polysilicon gates to be etched from the underlying polysilicon layer. That is, a gap may be formed in the line pattern, as illustrated in FIG. 5c where line pattern 531 of FIG. 5b has been patterned into gate patterns 531a and 531b by forming a gap 532 in line pattern 531. In patterning the mask here, any suitable patterning process may be used. Where the mask is a hard mask, for example, a layer of photosensitive material such as photoresist may be formed over the wafer; exposed to radiation such as ultraviolet radiation through a suitable gap mask, and developed to define in the photosensitive material the gap to be etched from the mask line pattern. The shape of the gap pattern in the photosensitive material is illustrated in FIG. 5c by dashed-line rectangle 533. It is to be understood, however, that the gap pattern is not limited to this illustrated shape but rather may be shaped differently in defining the gap to be etched from the mask line pattern. For example, the gap pattern may be shaped so as to extend across more than one mask line pattern so that polysilicon gates may be formed elsewhere over the wafer using this same mask. The gap pattern in the photosensitive material preferably exposes the entire width of the line pattern so as to ensure that the line pattern will be completely separated by the gap to be etched. It is to be appreciated that the gap pattern in the photosensitive material may expose portions of the polysilicon layer which are not covered by the mask line pattern. The gap may then be etched from the mask line pattern using a suitable etch technique and chemistry. For example, a timed or endpoint etch may be used. The etch may be selective to polysilicon to protect portions of the polysilicon layer which are not covered by the mask line pattern and which are exposed by the gap pattern in the photosensitive material. Where the mask layer comprises oxide, for example, the oxide:polysilicon selectivity of this etch may be in the range of approximately 5:1 to approximately 10:1. Other suitable selectivity ratios may also be used, however, and may depend on the thicknesses of the mask layer and the underlying polysilicon layer. It is to be appreciated, though, that the etch technique used here does not have to be highly selective to polysilicon because the underlying polysilicon subjected to this etch will later be removed. Following removal of the remaining photosensitive material, then, the pattern to create polysilicon gates from the underlying polysilicon layer remains, as illustrated in FIG. 5c.

The underlying polysilicon layer may now be etched in step 425 of FIG. 4 using the pattern created in the mask layer as a mask to form the polysilicon gates. That is, the polysilicon layer is etched to replicate in the polysilicon layer the pattern of the mask. This is illustrated in FIG. 5d where polysilicon layer 520 of FIGS. 5a–5c has been etched using gate patterns 531a and 531b as a mask to form polysilicon gates 521a and 521b. In etching the polysilicon layer using the mask, any suitable etch technique and chemistry may be used. As an example, a polysilicon:oxide selective etch may be used where the mask layer comprises silicon dioxide ($SiO_2$). This selective etch would also protect against spiking through the gate oxide layer. As another example, an etch selective to nitride may be used where the mask layer comprises silicon nitride ($Si_3N_4$). This etch may be a timed etch or an endpoint etch to minimize any overetch of the underlying gate oxide layer. The remaining mask 531a and 531b is then removed from the wafer in step 430 of FIG. 4.

Similar to the method of FIG. 2 discussed above, the gap formation essentially serves to "cut" the mask line pattern as the features of the gap pattern are perpendicular or substantially perpendicular to the mask line pattern. Accordingly, the lithographic rounding effects replicated at the ends of each polysilicon gate as a result of typical lithography processes are avoided. In applying the endcap rule then, as discussed above with regard to the method of FIG. 2, lithographic rounding effects need not be considered in determining the amount each polysilicon gate should extend over the edge of its active region. Transistors may thus be placed closer to one another over the wafer, providing for the fabrication of semiconductor devices with higher packing densities.

While the formation of the mask line pattern from the mask layer has been described above as having been performed prior to the formation of the gap in the line pattern, it is to be appreciated that the gap pattern may be formed from the mask layer prior to the formation of the mask line pattern from the mask layer. Where the mask layer is a hard mask layer, for example, the gap pattern and the mask line pattern may be etched using suitable etch techniques and chemistries. The mask line pattern etch, here, may be selective to polysilicon as portions of the underlying polysilicon layer may be subjected to this line pattern etch as a result of becoming exposed because of the gap etch.

As another exemplary application of the method of FIG. 4, a photosensitive material may be used for the mask to pattern the underlying polysilicon layer. Here, a photosensitive material such as photoresist may be formed over the polysilicon layer. The photosensitive material may then be exposed to radiation such as ultraviolet radiation through separate masks having features perpendicular or substantially perpendicular to one another. For example, a positive photoresist may be exposed to radiation such as ultraviolet radiation through a suitable line pattern mask and through a separate, suitable gap mask. This is illustrated in FIG. 6 where photoresist layer 630 has been exposed to radiation through a line pattern mask and through a separate gap mask. Photoresist layer 630 here has been formed over polysilicon layer 620, which has been formed over substrate 600 having field oxide region 610 and gate oxide layer 611. As illustrated in FIG. 6, photoresist layer 630 has been exposed to radiation through a line pattern mask in shaded regions 631 and 632. Photoresist layer 630 has also been exposed to radiation through a gap mask in shaded region 633. These separate masks may be used in any order. It is to be appreciated that portions of shaded regions 631 and 633 overlap and that portions of shaded regions 632 and 633 likewise overlap. The exposed portions of the positive photoresist will dissolve in the developer, leaving gate patterns similar to gate patterns 531a and 531b illustrated in FIG. 5c over the polysilicon layer. The underlying polysilicon layer may then be patterned using a suitable etch technique and chemistry. Here, a timed etch or an endpoint etch may be used. The etch may be selective to oxide to protect against spiking through the gate oxide layer. The remaining photosensitive material may then be removed following the polysilicon etch, leaving polysilicon gates similar to polysilicon gates 521a and 521b illustrated in FIG. 5d.

The methods of FIG. 2 and FIG. 4 produce similar results. However, the method of FIG. 4 may be more appropriate for patterning the polysilicon layer into polysilicon gates where two neighboring transistors are to share a common active region, as illustrated in FIG. 7 where polysilicon gates 721a and 721b share common active region 770. If the method of FIG. 2 were used, a portion of the common active region which is illustrated in FIG. 7 as shaded portion 771 may be subjected to a double overetch from two etch processes: one for the polysilicon line pattern and one for the gap pattern. As this common active region may be covered with only a thin gate oxide layer as illustrated in FIG. 7 with gate oxide layer 711, the double overetch of the polysilicon layer may spike through the gate oxide layer and etch into the underlying substrate. Using the method of FIG. 4 in this situation, however, the line and gap patterning are both simultaneously transferred to the polysilicon layer through the mask layer. The polysilicon layer is then etched only once, thus avoiding the possible spiking of the gate oxide layer due to a double overetch.

Figure 8:
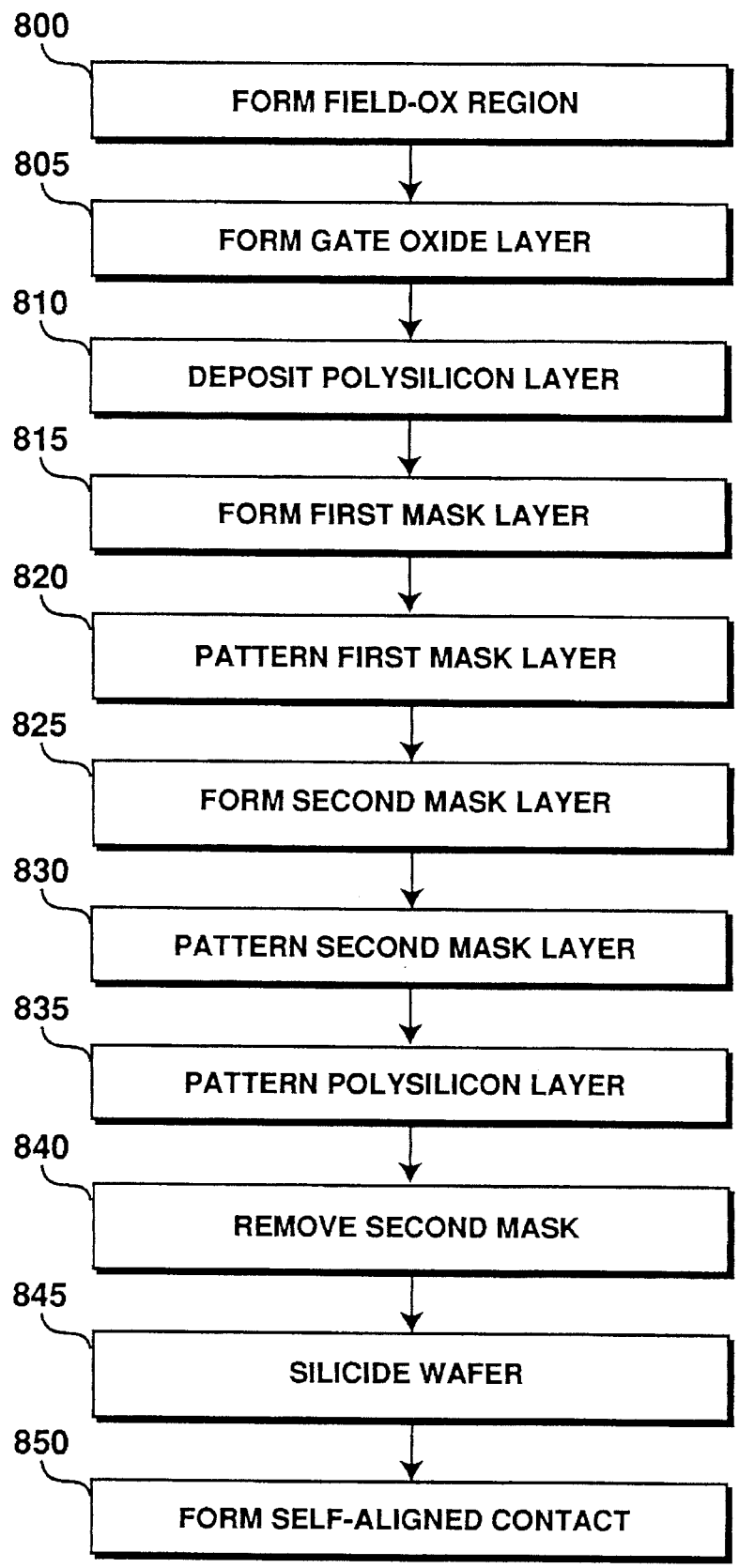
FIG. 8 illustrates, in the form of a flow diagram, a third exemplary method for patterning a layer formed over a semiconductor substrate in accordance with the present invention.

The present invention may also be used in conjunction with other processing techniques. For example, the present invention may be used to pattern layers in fabricating semiconductor devices where selectively silicided polysilicon is used. The present invention may also be used with self-aligned contact processes. FIG. 8 illustrates, in the form of a flow diagram, a third exemplary method in accordance with the present invention for patterning a layer formed over a semiconductor substrate in conjunction with such other processing techniques. So as to better explain this third exemplary method of the present invention, FIGS. 9a, 9b, and 9c will be used to illustrate the steps performed in the method of FIG. 8.

Steps 800, 805, and 810 of FIG. 8 are similarly performed as steps 200, 205, and 210 of FIG. 2, respectively, discussed above. The above discussion pertaining to steps 200, 205, and 210 therefore similarly applies here as well. Briefly, a field oxide region, a gate oxide layer, and a polysilicon layer are formed over a semiconductor substrate. This is illustrated in FIG. 9a where field oxide regions 910, gate oxide layer 911, and polysilicon layer 920 have been formed over substrate 900.

A first mask layer is then formed over the wafer in step 815 of FIG. 8. The material used for the first mask layer may be, for example, silicon dioxide ($SiO_2$), silicon nitride ($Si_3N_4$), or some other hard mask material. Another suitable material or materials may also be used. While a first mask layer comprising silicon dioxide ($SiO_2$) may be grown over the wafer, it is preferably deposited as the growth of this layer may unduly deplete the underlying polysilicon layer of silicon. Where the first mask layer is a hard mask layer, the thickness of this first mask layer may be, for example, approximately 2000 Å to approximately 3000 Å. Other thicknesses may also be used, though, and may depend on the material used for the first mask layer. The thickness of the first mask layer may also depend on other processing considerations, such as subsequent etch techniques and chemistries used to etch polysilicon gates from the underlying polysilicon layer. As this first mask layer may serve to insulate self-aligned contacts from the polysilicon gates, the material or materials used for the first mask layer are preferably dielectric. A first mask comprising a dielectric material will also prevent any silicide formation over underlying portions of the polysilicon gates. This is discussed in more detail below.

This first mask layer may then be patterned in step 820 of FIG. 8, as illustrated in FIG. 9a where patterned first mask layer 940 has been formed over polysilicon layer 920. The patterned first mask may serve to define where self-aligned contacts will be formed if the first mask is to be used to insulate self-aligned contacts from the polysilicon gates. The patterned first mask may also define the polysilicon areas which are to be silicided as the patterned first mask may prevent or block underlying polysilicon from reacting with a later deposited material in forming a silicide layer over select portions of the polysilicon. In patterning the first mask layer here, any suitable patterning process may be used. Where the first mask layer is a hard mask layer, for example, a layer of photosensitive material such as photoresist may be formed over the wafer, exposed to radiation such as ultraviolet radiation through a suitable silicide-block mask, and developed to define in the photosensitive material the silicide-block pattern to be etched from the first mask layer. It is to be appreciated here that the term "silicide-block" is not meant to be used in a limiting sense but rather is merely used as a convenient label. That is, the use of the term "silicide-block" is not to be construed as a requirement that the first mask be used to block silicide formation from portions of the underlying layer. The silicide-block pattern may then be etched from the first mask layer using a suitable etch technique and chemistry. For example, a timed etch or an endpoint etch may be used. The etch may be selective to polysilicon to minimize any overetch effects on the underlying polysilicon. As portions of this polysilicon will remain as part of the polysilicon gates formed over the wafer, the polysilicon is preferably subjected to as little overetch as possible. The remaining photosensitive material may then be removed following this etch.

After the first mask layer has been patterned, steps 825, 830, 835, and 840 of FIG. 8 may then be performed to pattern the polysilicon layer. It is to be appreciated that the first mask layer may also be patterned in the performance of these steps. Steps 825, 830, 835, and 840 of FIG. 8 correspond to steps 415, 420, 425, and 430 of FIG. 4 discussed above. Accordingly, the above discussion pertaining to steps 415, 420, 425, and 430, including the discussion pertaining to the use of photosensitive material for the mask of FIG. 4, similarly applies here as well.

To provide an exemplary application of these steps, a second mask layer is formed over the semiconductor wafer in step 825 of FIG. 8. The second mask layer may contain any suitable material or materials which may be patterned to provide for a mask when the underlying polysilicon layer is etched. The second mask layer may be a hard mask layer, for example, comprising silicon dioxide ($SiO_2$), which may be deposited or grown over the polysilicon layer, or comprising silicon nitride ($Si_3N_4$). The second mask layer may be of any suitable thickness. This thickness may depend, for example, on the deposition technique used to form this mask layer or any etch technique used to etch this mask layer. Where the second mask layer is a hard mask layer and where the first mask layer is to be etched while patterning the second mask layer, the thickness of the second mask layer is preferably no more than approximately 20 percent of the thickness of the first mask layer.

The second mask layer is then patterned in step 830 of FIG. 8 to define the pattern for polysilicon gates to be etched from the underlying polysilicon layer, as illustrated in FIG. 9b where the second mask layer has been patterned into gate patterns 951a, 951b, 951c, 951d, 951e, and 951f. For example, the second mask layer may first be patterned to define a line pattern for the underlying polysilicon layer. This line pattern in the second mask crosses over active regions separated by field oxide regions. In patterning the second mask layer here, any suitable patterning process may be used. Where the second mask layer is a hard mask layer, for example, a layer of photosensitive material such as photoresist may be formed over the wafer, exposed to radiation such as ultraviolet radiation through a suitable line pattern mask, and developed to define in the photosensitive material the line pattern to be etched from the second mask layer. The second mask layer may then be etched using a suitable etch technique and chemistry to form the line pattern. The remaining photosensitive material may then be removed following this etch.

It is to be appreciated here that portions of the first mask layer which underlie the second mask layer may also be etched in patterning the second mask layer, as illustrated in FIG. 9b where the first mask of FIG. 9a has been patterned into silicide-block patterns 941a and 941b. The second mask layer may preferably comprise the same material as that of the first mask layer so as to simplify this etching process. For example, they may both comprise silicon dioxide ($SiO_2$). Although not necessary in order to practice the present invention, both the second mask layer and the first mask layer may then be etched in one process step. For example, an etch selective to polysilicon may be used here so as to ensure that both the first and second mask layers are fully etched without etching through the underlying polysilicon, and thus through the gate oxide layer into the underlying substrate.

Once the line pattern has been formed from the second mask layer, it may be patterned again to define the polysilicon gates to be etched from the underlying polysilicon layer. That is, a gap may be formed in the line pattern of the second mask layer. In patterning the second mask here, any suitable patterning process may be used. Where the second mask is a hard mask, for example, a layer of photosensitive material such as photoresist may be formed over the wafer, exposed to radiation such as ultraviolet radiation through a suitable gap mask, and developed to define in the photosensitive material the gap to be etched from the line pattern of the second mask layer. The gap pattern in the photosensitive material preferably exposes the entire width of the line pattern so as to ensure that the line pattern will be completely separated by the gap to be etched. It is to be appreciated that the gap pattern in the photosensitive material may expose portions of the polysilicon layer which are not covered by the line pattern of the second mask layer. The gap may then be etched from the mask line pattern using a suitable etch technique and chemistry. Following removal of the remaining photosensitive material, then, the pattern to create polysilicon gates from the underlying polysilicon layer remains, as illustrated in FIG. 9b.

While the formation of the line pattern from the second mask layer has been described in the example above as having been performed prior to the formation of the gap in the line pattern, it is to be appreciated that the gap pattern may be formed from the second mask layer prior to the formation of the line pattern from the second mask layer. Where the second mask layer is a hard mask layer, for example, the gap pattern and the mask line pattern may be etched using suitable etch techniques and chemistries. The mask line pattern etch, here, may be selective to polysilicon as portions of the underlying polysilicon may be subjected to this line pattern etch as a result of becoming exposed because of the gap etch.

As another example where photosensitive material such as positive photoresist is used for the second mask layer, the photosensitive material may be exposed to radiation such as ultraviolet radiation through a suitable line pattern mask and through a separate, suitable gap mask. These separate masks may be used in any order. The exposed portions of positive photoresist, for example, may then be dissolved in developer leaving suitable gate patterns over the polysilicon layer, as illustrated in FIG. 9b where the second mask layer has been patterned into gate patterns 951a, 951b, 951c, 951d, 951e, and 951f. As portions of the first mask layer may remain exposed over the surface of the wafer, these portions may then be etched using a suitable etch technique and chemistry to create silicide-block patterns, as illustrated in FIG. 9b where the first mask of FIG. 9a has been patterned into silicide-block patterns 941a and 941b.

The underlying polysilicon layer may now be etched in step 835 of FIG. 8 using the pattern created in the second mask layer as a mask to form the polysilicon gates. That is, the polysilicon layer is etched to replicate in the polysilicon layer the pattern of the second mask. This is illustrated in FIG. 9c where polysilicon layer 920 of FIGS. 9a–9b has been etched using gate patterns 951a, 951b, 951c, 951d, 951e, and 951f as a mask to form polysilicon gates 921a, 921b, 921c, 921d, 921e, and 921f, respectively. In etching the polysilicon layer using the second mask, any suitable etch technique and chemistry may be used. The remaining second mask is then removed from the wafer in step 840 of FIG. 8.

Similar to the method of FIG. 2 discussed above, the gap formation essentially serves to "cut" the line pattern in the second mask layer as the features of the gap pattern are perpendicular or substantially perpendicular to this line pattern. Accordingly, lithographic rounding effects replicated at the ends of each polysilicon gate as a result of typical lithography processes are avoided. In applying the endcap rule then, as discussed above with regard to the method of FIG. 2, lithographic rounding effects need not be considered in determining the amount each polysilicon gate should extend over the edge of its active region. Transistors may thus be placed closer to one another over the wafer, providing for the fabrication of semiconductor devices with higher packing densities.

Now that the polysilicon gates have been formed over the wafer, the semiconductor wafer may be selectively silicided in step 845 of FIG. 8. Prior to doing so, however, suitable sidewall spacers may be formed to cover the sides of the polysilicon gates. Preferably, these sidewall spacers are made of a dielectric material, such as silicon dioxide ($SiO_2$) or silicon nitride ($Si_3N_4$), as these sidewall spacers may serve to prevent silicide formation on the covered portions, thus ensuring no shorts are created between the polysilicon gates and any diffusion regions in the substrate as a result of this silicide process. The gate oxide layer may also be etched prior to this selective silicide process so as to define diffusion regions in the substrate which may also be silicided.

A metal layer may then be deposited over the wafer. While in one embodiment this metal comprises titanium (Ti), other suitable materials such as cobalt (Co) may also be used here. As a general example, any refractory metal which can withstand subsequent processing temperatures may be used. When the wafer is heated, then, the metal layer will react with silicon in the polysilicon gates and in other areas containing silicon which are in direct contact with the metal, such as any diffusion regions in the substrate. Such a reaction produces a silicide layer. For example, a layer of titanium silicide ($TiSi_2$) or of cobalt silicide ($CoSi_2$) is formed where the metal layer contains titanium (Ti) or cobalt (Co), respectively. The resulting silicide layer may, for example, serve to reduce the resistivity of the silicided regions. For example, the resistivity of those portions of the polysilicon gates which have been silicided may be reduced as a result of this silicide process. The metal layer does not react with silicon dioxide ($SiO_2$), for example the field oxide regions, or with regions not containing silicon. It is to be appreciated that where the first mask comprises a dielectric material such as $SiO_2$, the metal will not react with those portions of the polysilicon gates covered by the silicide-block patterns in the first mask, as illustrated in FIG. 9c where polysilicon gates 921a and 921b are at least partially covered by silicide-block patterns 941a and 941b, respectively, from first mask layer 940 of FIG. 9a. Any unreacted metal may then be removed from the substrate following this silicide process, for example by using an etchant which does not attack the silicide, the substrate, or silicon dioxide. While the diffusion regions may be implanted after this silicide process, it is to be understood that the diffusion regions may be implanted at other times, for example just prior to this silicide process. Furthermore, the above silicide process may be more appropriately termed a salicide process—that is, a Self-ALigned silICIDE process—as the silicide regions may be formed without concern for the alignment of any masks or patterns.

While a specific silicide process is described above, it is to be appreciated that other silicide processes may be used to form various silicide layers over the polysilicon gates and/or any diffusion regions. For example, rather than having a metal layer reacting with silicon in various regions on the surface of the wafer, a silicide layer may be deposited over the wafer and selectively etched to define silicide layers over the polysilicon gates and/or diffusion regions. For example, tungsten silicide ($WSi_2$) may be used in this manner. It is also to be appreciated that while the polysilicon gates and/or any diffusion regions are described above as being silicided after the second mask has been removed, the polysilicon gates and/or any diffusion regions may be silicided at other times as well. For example, the polysilicon layer formed over the wafer in step 810 of FIG. 8 may be silicided prior to the formation of the first mask layer in step 815 of FIG. 8. Where this is done, however, the etch technique and chemistry used to etch polysilicon gates from the polysilicon layer may need to account for the silicide layer over the polysilicon.

After the silicide process in step 845 of FIG. 8, self-aligned contacts may be formed in step 850 of FIG. 8 using suitable process steps as required for the desired semiconductor device being fabricated. It is to be appreciated that a self-aligned contact may be formed, for example, between polysilicon gates, as illustrated in FIG. 9c where a self-aligned contact may be formed in gap 960 between polysilicon gates 921a and 921b. The self-aligned contact may be formed to provide for an electrical connection to the underlying substrate, for example to a diffusion region in the substrate. The material from the first mask layer which remains over the polysilicon gates, as illustrated in FIG. 9c with silicide-block patterns 941a and 941b, may be used in forming this self-aligned contact as the self-aligned contact must be insulated from the polysilicon gates to avoid shorting the gates to the underlying substrate through the self-aligned contact. Where sidewall spacers have been formed on the sides of the polysilicon gates to prevent silicide formation as discussed above, such sidewall spacers may also be used to insulate the self-aligned contact from the polysilicon gates.

While the above description of the method of FIG. 8 discusses the use of a silicide process and self-aligned contact process, it is to be appreciated that the silicide process and the self-aligned contact process are not necessary in practicing the present invention. More clearly, the silicide process and the self-aligned contact process are optional processes; neither process, either process, or both processes may be used in practicing the present invention to create transistor gates.

FIGS. 10a, 10b, 10c, 10d, and 10e illustrate, in cross-sectional views of a semiconductor wafer, another exemplary application of the method of FIG. 8. In this application, steps 800, 805, and 810 are similarly performed as described above, and thus the above discussion pertaining to these steps applies here as well. This is illustrated in FIG. 10a where field oxide regions 1010, gate oxide layer 1011, and polysilicon layer 1020 have been formed over substrate 1000.

Steps 815 and 820 of FIG. 8 are also similarly performed as described above, and thus the above discussion pertaining these steps applies here as well. However, the first mask layer here may be patterned not only as described above but also to define a gap to be etched from the underlying polysilicon layer. The patterned first mask is illustrated in FIG. 10a where the first mask layer has been patterned into regions 1040a and 1040b and has been patterned to define gap 1070. Where the first mask layer is a hard mask layer, for example, the silicide-block pattern and the gap pattern may be either simultaneously etched from the first mask layer or separately etched using a suitable etch technique and chemistry. When separately etched, the silicide-block pattern and the gap pattern may be etched from the first mask layer in any order.

Figure 10B:
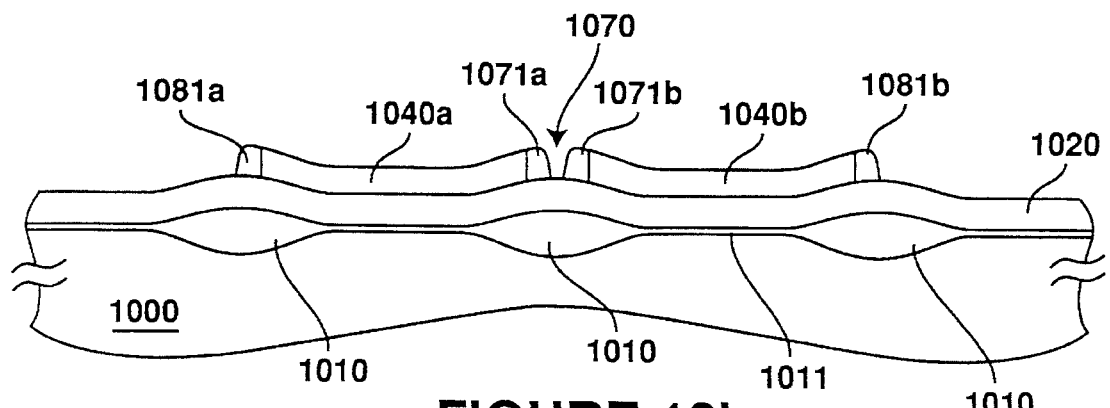
FIG. 10b illustrates a cross-sectional view of the semiconductor wafer of FIG. 10a following an optional spacer formation in accordance with the present invention.

Following the patterning of the first mask layer, spacers may be added to the gap region of the patterned first mask, as illustrated in FIG. 10b where sidewall spacers 1071a and 1071b have been formed in gap 1070. These spacers may comprise any suitable material. For example, silicon dioxide ($SiO_2$) or silicon nitride ($Si_3N_4$) may be used. Also, the spacers may comprise a material that is the same or different from that used for the first mask layer. In forming the spacers, any suitable processing technique may be used. For example, a layer of the material used for the spacers may be deposited over the semiconductor wafer. A suitable anisotropic etch may then be used to remove portions of the deposited layer, leaving spacers in the gap defined in the first mask. Sidewall spacers may also be left on other portions of the wafer, as illustrated in FIG. 10b where sidewall spacers 1081a and 1081b have also been formed on the sides of patterned regions 1040a and 1040b, respectively.

It is to be appreciated that this spacer formation is optional; it is not necessary to implement the spacer technique to practice the method of FIG. 8 for this exemplary application. With or without this spacer formation, steps 825 through 850 are nevertheless performed in substantially the same manner as summarized below. That is, implementing the optional spacer formation does not substantially alter the exemplary application of the method of FIG. 8 here. Furthermore, the use of spacers advantageously reduces the width of the gap formed in the first mask. When this gap has been defined as small as lithographic resolution permits, then, the spacing between two polysilicon gates as defined by this gap may be made smaller than lithographically possible because of the spacer formation. This is discussed in further detail below.

Figure 10C:
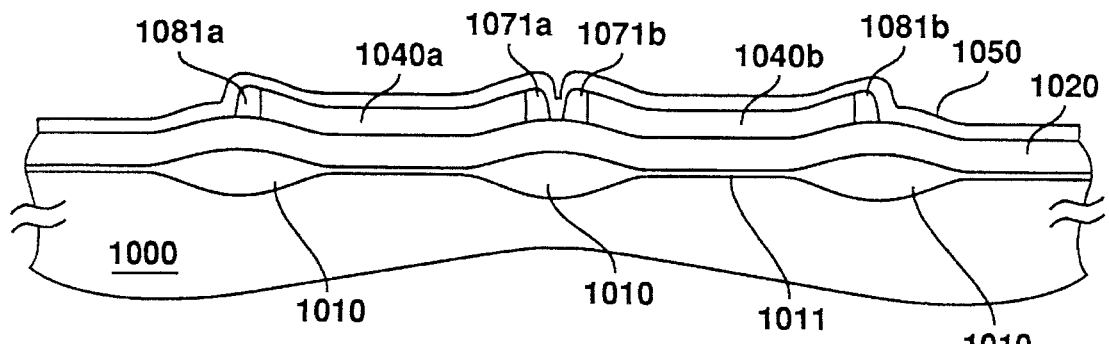
FIG. 10c illustrates a cross-sectional view of the semiconductor wafer of FIG. 10b following the formation of a mask layer in accordance with the present invention.

Steps 825, 830, 835, 840, 845, and 850 of FIG. 8, then, are similarly performed as described above, and thus the above discussion pertaining to these steps applies here as well. Here, FIG. 10c illustrates the formation of a second mask layer in step 825 of FIG. 8 where second mask layer 1050 has been formed over the semiconductor wafer.

Figure 10D:
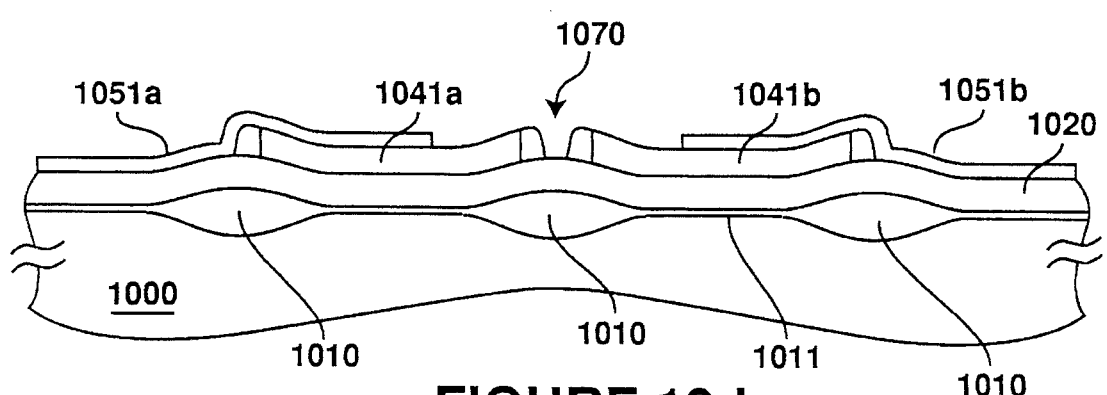
FIG. 10d illustrates a cross-sectional view of the semiconductor wafer of FIG. 10c following the patterning of the mask layer in accordance with the present invention.

With regard to step 830 of FIG. 8, the second mask layer may be first patterned to define the gap between polysilicon gates, as illustrated in FIG. 10d where a portion of the second mask layer 1050 has been removed from gap 1070. It is to be appreciated here that the gap defined in the second mask layer may be wider than the gap defined in the first mask layer. This allows for some misalignment of the gap mask in patterning the gap in the second mask layer so that it overlies the gap patterned in the first mask layer. The error margin for this alignment, however, should not be so large that a potential gap in the second mask layer would directly overlie any polysilicon not covered by the gap region and the silicide-block pattern regions in the first mask layer. Where the second mask layer is a hard mask layer, for example, any suitable etch technique and chemistry may be used to etch the gap from the second mask layer. The etch technique may depend on the specific materials used for the first mask, the second mask, and any sidewall spacers in the gap defined by the first mask. The etch technique may also depend on whether a second mask comprising silicon dioxide ($SiO_2$) was grown or deposited over the wafer. As an example, a timed etch may be used where the second mask layer has been deposited over the wafer, regardless of the materials used for the first mask, the second mask, or any sidewall spacers. As a further example, a selective etch may be used where the material used for the first mask is different from material deposited for the second mask layer. Here, the selective etch would avoid gouging into the first mask while etching the gap in the second mask. The etch technique is preferably also selective to the material used for any sidewall spacers in the first mask gap to prevent them from being etched. Furthermore, the etch technique used may be anisotropic to protect any sidewall spacers in the gap defined by the first mask from being etched. Where the second mask layer has been deposited, spacers from the second mask may be formed covering any original sidewall spacers in the first mask gap as a result of such an anisotropic etch.

The second mask layer is also patterned to define the line pattern for the underlying polysilicon layer as described above. Where the second mask layer is a hard mask layer and is etched to form the line pattern, it is to be appreciated that portions of the first mask layer which underlie the second mask layer may also be etched in forming the line pattern. This is illustrated in FIG. 10d where the first mask regions 1040*a* and 1040*b* of FIG. 10*a* have been patterned into silicide-block patterns 1041*a* and 1041*b*. Overall, the second mask layer is patterned into gate patterns to define, possibly in conjunction with the silicide-block patterns of the first mask layer, the polysilicon gates to be etched from the underlying polysilicon layer. This is illustrated in FIG. 10*d* where gate patterns 1051*a* and 1051*b* and silicide-block patterns 1041*a* and 1041*b* remain over the surface of the wafer.

Figure 10E:
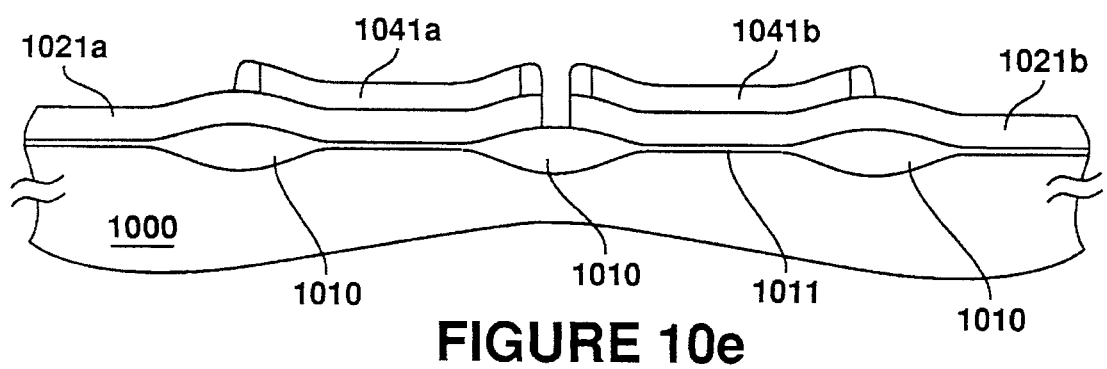
FIG. 10e illustrates a cross-sectional view of the semiconductor wafer of FIG. 10d following an etch of an underlying layer using the patterned mask layer in accordance with the present invention.

With regard to steps 835 and 840, FIG. 10*e* illustrates the formation of polysilicon gates 1021*a* and 1021*b* which have been etched from polysilicon layer 1020 using gate patterns 1051*a* and 1051*b*. It is to be appreciated that the etch technique and chemistry used to etch the polysilicon layer here may depend on the materials used for the first mask, the second mask, and any sidewall spacers in the gap of the first mask. It is also to be appreciated that where sidewall spacers have been formed in the gap of the first mask, the spacing between polysilicon gates may be made smaller than lithographically possible as the gate patterns are replicated in the underlying polysilicon layer. Accordingly, the spacing between transistors may be reduced because of this reduced poly-poly spacing. The spacing between transistors may be reduced even further as the minimum amount each polysilicon gate should extend over the edge of its active region need not account for lithographic rounding effects under the endcap rule. Semiconductor devices may thus be fabricated with higher packing densities. Steps 845 and 850 of FIG. 8 may now be similarly performed as described above.

Although optional, the patterning of the gap pattern in the first mask layer as described in the above exemplary application of the method of FIG. 8 as illustrated in FIGS. 10*a*–10*e* is preferably performed to allow for a less critical alignment of the gap mask in patterning the gap in the second mask layer. With higher tolerances for inaccuracies in aligning this gap mask, then, less expensive equipment may be used than would otherwise be needed if the gap were not initially formed in the first mask layer as discussed above. If the gap were not initially formed in the first mask layer, for example, it may be formed from the first mask layer in accordance with the gap formed in the second mask. Where the first and second mask layers are hard mask layers, for example, the gaps in the first mask and the second mask may be etched simultaneously or separately. When they are etched simultaneously, the materials used for the first and second mask are preferably the same so as to simplify this etch process. In this example, however, the alignment of the gap mask in patterning the gap in the second mask layer is more critical as the gap in the second mask layer will be used to define the spacing between two polysilicon gates. More costly equipment would then be needed to provide for such a critical alignment.

Having described various exemplary methods in accordance with the present invention to form transistor gates over a semiconductor wafer, the resulting semiconductor wafer may now be used in fabricating various semiconductor devices and integrated circuits including, but not limited to, those for various semiconductor memory components such as SRAMs, microprocessors, and various other semiconductor devices.

While the above description describes the use of a polysilicon layer in forming transistor gates for fabricating various semiconductor devices, it is to be appreciated that other materials, and particularly other conductive materials such as metals, may be used in forming transistor gates in accordance with the present invention. Of course various other processing techniques may be required where materials other than polysilicon are used in practicing the present invention. For example, a different etch technique and chemistry may be needed as the etch techniques used in accordance with the present invention may depend upon the specific material being patterned.

While the above description also describes the use of a line pattern and a gap pattern in forming transistor gates, it is to be appreciated that differently shaped patterns may also be used to define transistor gates while still reducing or avoiding lithographic rounding effects in accordance with the present invention. For example, it is not necessary that the transistor gates formed in accordance with the present invention be patterned with line patterns as described above and as illustrated in the drawings. Rather, the transistor gates may be defined using differently shaped patterns, for example L-shaped patterns.

While the above description further describes the use of sidewall spacers in the gap defined by the first mask in the exemplary application of the method of FIG. 8 as illustrated in FIGS. 10*a*–10*e*, it is to be appreciated that sidewall spacers of a suitable material may also be formed in the gap defined by the second mask used in the method of FIG. 8 to obtain sub-lithographic spacings between transistor gates. Sidewall spacers of a suitable material may also be formed in the gap defined by the mask used in the method of FIG. 4 for this same purpose. The thicknesses of these masks, though, may need to be increased to accommodate such sidewall spacers. As an alternative to the use of spacers, a phase-shift mask may also be used to provide for sublithographic spacings.

A method for avoiding lithographic rounding effects for semiconductor fabrication has thus been described. In accordance with the present invention, a patterning or etch process which reduces or avoids lithographic rounding effects may now be used in fabricating various semiconductor devices. The present invention may also be used to reduce the minimum extension of a transistor gate over the edge of its active region under the endcap rule. In this regard, the present invention may be used for fabricating semiconductor devices with higher packing densities as transistors may be placed closer to one another in fabricating semiconductor devices.

While the above description describes the use of the present invention with regard to forming transistor gates, it is to be appreciated that the present invention may also be used in patterning or etching layers for purposes other than those with regard to the formation of transistor gates. Essentially, the present invention is not meant to be limited to only the specific purpose of patterning transistor gates but rather may also be used in patterning or etching any layer or layers in fabricating various semiconductor devices. For example, the present invention may be used in lieu of typical lithography processes so as to reduce or avoid lithographic rounding effects in patterning a given layer of material. The present invention may thus be used in this example merely to obtain more well-defined patterns for semiconductor fabrication. Here, separate masks having features perpendicular or substantially perpendicular to one another may be used in a manner similar to that described above to provide for such well-defined patterns.

While the detailed description in accordance with the present invention has been set forth above with regard to the best mode and preferred embodiment or embodiments contemplated by the inventors, it is to be appreciated that the present invention is not limited to the above embodiment or embodiments and that various modifications may be made to the above embodiment or embodiments without departing from the broader spirit or scope of the present invention as defined in the following claims. The specific embodiment or embodiments are, accordingly, to be regarded in an illustrative rather than a restrictive sense.

What is claimed is:

1. A method for use in semiconductor fabrication comprising the steps of:
   (a) forming over a semiconductor substrate a first layer comprising a first material;
   (b) forming over the semiconductor substrate a mask layer comprising a second material;
   (c) patterning the mask layer in accordance with a first pattern and a second pattern, wherein the patterning step (c) includes the steps of;
      (i) using the first pattern for defining the mask layer, and
      (ii) using the second pattern for defining the mask layer after the first pattern has been used in the using step (c)(i);
      (iii) patterning the mask layer in accordance with the first and second patterns; and
   (d) patterning the first layer in accordance with the mask layer after the mask layer has been patterned in the pattering step (c), wherein the first material comprises a conductive material and wherein the patterning step (d) patterns the first layer to form transistor gates over the semiconductor substrate.

2. A method for use in semiconductor fabrication comprising the steps of:
   (a) forming over a semiconductor substrate a first layer comprising a first material;
   (b) forming over the semiconductor substrate a mask layer comprising a second material;
   (c) patterning the mask layer in accordance with a first pattern and a second pattern, wherein the patterning step (c) includes the steps of:
      (i) using the first pattern for defining the mask layer, and
      (ii) using the second pattern for defining the mask layer after the first pattern has been used in the using step (c)(i);
      (iii) patterning the mask layer in accordance with the first and second patterns; and
   (d) patterning the first layer in accordance with the mask layer after the mask layer has been patterned in the patterning step (c), wherein the second material comprises a material selected from the group consisting of oxide and nitride.

3. A method for use in semiconductor fabrication comprising the steps of:
   (a) forming over a semiconductor substrate a first layer comprising a first material;
   (b) forming over the semiconductor substrate a second layer comprising a second material;
   (c) patterning the second layer in accordance with a first pattern and a second pattern, wherein the patterning step (c) includes the steps of;
      (i) using the first pattern for defining the mask layer, and
      (ii) using the second pattern for defining the mask layer after the first pattern has been used in the using step (c)(i);
      (iii) patterning the mask layer in accordance with the first and second patterns; and
   (d) patterning the first layer in accordance with the mask layer after the mask layer has been patterned in the patterning step (c), wherein the patterning step (c) comprises the step of forming a gap in the mask layer;
   wherein the method further comprises the step of forming spacers in the gap of the mask layer; and
   wherein the patterning step (d) comprises the step of patterning the first layer in accordance with the mask layer after the mask layer has been patterned in the patterning step (c) and after the spacers have been formed in the gap of the mask layer.

4. A method for use in semiconductor fabrication comprising the steps of:
   (a) forming over a semiconductor substrate a first layer comprising a first material;
   (b) forming over the semiconductor substrate a second layer comprising a second material;
   (c) patterning the second layer in accordance with a first pattern;
   (d) forming a mask layer comprising a third material over the second layer after the second layer has been patterned in the patterning step (c);
   (e) patterning the mask layer in accordance with a second pattern and a third pattern, wherein the patterning step (e) includes the steps of:
      (i) using the second pattern for defining the mask layer, and
      (ii) using the third pattern for defining the mask layer after the second pattern has been used in the using step (e)(i);
      (iii) patterning the mask layer in accordance with the second and third patterns; and
   (f) patterning the first layer in accordance with the mask layer after the mask layer has been patterned in the patterning step (e).

5. The method of claim 4, wherein the using step (e)(i) comprises the step of patterning the mask layer in accordance with the second pattern; and
   wherein the using step (e)(ii) comprises the step of patterning the mask layer in accordance with the third pattern after the mask layer has been patterned in the using step (e)(i).

6. The method of claim 4, wherein the second pattern comprises a first feature and wherein the third pattern comprises a second feature substantially perpendicular to the first feature.

7. The method of claim 5, wherein the second pattern comprises a first feature and wherein the third pattern comprises a second feature substantially perpendicular to the first feature.

8. The method of claim 6, wherein the first material comprises a conductive material and wherein the patterning step (f) patterns the first layer to form transistor gates over the semiconductor substrate.

9. The method of claim 7, wherein the first material comprises a conductive material and wherein the patterning step (f) patterns the first layer to form transistor gates over the semiconductor substrate.

10. The method of claim 4, wherein the third material comprises photosensitive material.

11. The method of claim 5, wherein the third material comprises a material selected from the group consisting of oxide and nitride.

12. The method of claim 4, further comprising the step of forming a silicide layer over exposed portions of the first layer.

13. The method of claim 4, wherein the patterning step (c) comprises the step of forming a gap in the second layer;

wherein the method further comprises the step of forming spacers in the gap of the second layer; and wherein the patterning step (f) comprises the step of patterning the first layer in accordance with the mask layer and in accordance with the second layer after the second layer has been patterned in the patterning step (c) and after the spacers have been formed in the gap of the second layer.

14. A method for use in semiconductor fabrication comprising the steps of:

(a) forming over a semiconductor substrate a first layer comprising a first material;

(b) forming over the semiconductor substrate a mask layer comprising a second material;

(c) patterning the mask layer in accordance with a first pattern and a second pattern, wherein the patterning step (c) includes the steps of:
  (i) using the first pattern for defining the mask layer, and
  (ii) using the second pattern for defining the mask layer after the first pattern has been used in the using step (c)(i);
  (iii) patterning the mask layer in accordance with the first and second patterns; and (d) patterning the first layer in accordance with the mask layer after the mask layer has been patterned in the patterning step (c), wherein the patterning step (c) patterns the mask layer to form a patterned mask layer having a pattern separated by a gap.

15. A method for use in semiconductor fabrication comprising the steps of:

(a) forming over a semiconductor substrate a first layer comprising a first material;

(b) forming over the semiconductor substrate a mask layer comprising a second material;

(c) patterning the mask layer in accordance with a first pattern and a second pattern, wherein the patterning step (c) includes the steps of:
  (i) using the first pattern for defining the mask layer, and
  (ii) using the second pattern for defining the mask layer after the first pattern has been used in the using step (c)(i);
  (iii) patterning the mask layer in accordance with the first and second patterns; and (d) patterning the first layer in accordance with the mask layer after the mask layer has been patterned in the patterning step (c), wherein the first pattern comprises a line pattern and wherein the second pattern comprises a gap pattern.

16. The method of claim 4, wherein the patterning step (e) pattern the mask layer to form a patterned mask layer having a pattern separated by a gap.

17. The method of claim 4, wherein the second pattern comprises a line pattern and wherein the third pattern comprise a gap pattern.

18. The method of claim 4, wherein the second material comprises a material selected from the group consisting of oxide and nitride.

19. A method for use in semiconductor fabrication comprising the steps of:

(a) forming over a semiconductor substrate a first layer comprising a first material;

(b) forming over the semiconductor substrate a mask layer comprising a second material;

(c) patterning the mask layer in accordance with a first pattern and a second pattern, wherein the patterning step (c) includes the steps of;
  (i) using the first pattern for defining the mask layer, and
  (ii) using the second pattern for defining the mask layer after the first pattern has been used in the using step (c)(i), and
  (iii) patterning the mask layer in accordance with the first and the second patterns, wherein the first pattern comprises a line pattern and wherein the second pattern comprises a gap pattern; and;

(d) patterning the first layer in accordance with the patterned mask layer.

20. The method of claim 19, wherein the first pattern comprises a first feature and wherein the second pattern comprises a second feature substantially perpendicular to the first feature.

21. The methods of claim 19, wherein the second material comprises photoresist.

22. The method of claim 19, wherein the first material comprises a conductive material.

23. The method of claim 22, wherein the patterning step (d) patterns the first layer to form transistor gates over the semiconductor substrate.

24. A method for use in semiconductor fabrication comprising the step of:

depositing a first layer on a substrate;

depositing a photosensitive layer on said first layer;

exposing said photosensitive layer to a first pattern having a first feature; and exposing said photosensitive layer to a second pattern having a second feature, wherein at least a portion of one of said first and said second features overlaps at least a portion of the other of said first said second features.

25. The method of claim 24 further comprising the step of developing said photosensitive layer to form a patterned photosensitive layer.

26. The method as described in claim 25 wherein said step of developing said photosensitive layer is performed after said steps of exposing said photosensitive layer to said first pattern and exposing said photosensitive layer to said second pattern, without a development step between said steps of exposing said photosensitive layer to said first pattern and exposing said photosensitive layer to said second pattern.

27. The method as described in claim 25 wherein said step of developing said photosensitive layer comprises developing said photosensitive layer after said step of exposing said photosensitive layer to said first pattern and developing said photosensitive layer after said step of exposing said photosensitive layer to said second pattern.

28. The method as described in claim 24 wherein said first feature is substantially perpendicular to said second feature.

29. The method as described in claim 25 wherein said patterned photosensitive layer comprises a transistor gate pattern.

30. The method as described in claim 26 wherein said patterned photosensitive layer comprises a transistor gate pattern.

* * * * *